US008586140B2

(12) United States Patent
Furuya (10) Patent No.: US 8,586,140 B2
(45) Date of Patent: Nov. 19, 2013

(54) FILM FORMATION METHOD FOR FORMING HAFNIUM OXIDE FILM (75) Inventor: Haruhiko Furuya, Nirasaki (JP)

(73) Assignee: Tokyo Electron Limited, Tokyo (JP)

(*) Notice: Subject to any disclaimer, the term of this patent is extended or adjusted under 35 U.S.C. 154(b) by 168 days.

(21) Appl. No.: 13/178,005

(22) Filed: Jul. 7, 2011

(65) Prior Publication Data

US 2011/0268872 A1 Nov. 3, 2011

Related U.S. Application Data (62) Division of application No. 12/073,570, filed on Mar. 6, 2008, now abandoned.

(30) Foreign Application Priority Data

Mar. 16, 2007 (JP) ................................. 2007-068206

(51) Int. Cl.
*C23C 16/00* (2006.01)
*B05D 5/12* (2006.01)

(52) U.S. Cl.
USPC ............ 427/255.31; 427/255.28; 427/255.29; 427/248.1

(58) Field of Classification Search
None
See application file for complete search history.

(56) References Cited

U.S. PATENT DOCUMENTS

| 7,196,211 | B2 | 3/2007 | Itsuki et al. | |
|---|---|---|---|---|
| 7,326,988 | B2 | 2/2008 | Yamamoto | |
| 2005/0229970 | A1* | 10/2005 | Birtcher et al. | 137/240 |
| 2005/0271812 | A1* | 12/2005 | Myo et al. | 427/248.1 |
| 2005/0287806 | A1* | 12/2005 | Matsuura | 438/680 |
| 2006/0182885 | A1 | 8/2006 | Lei et al. | |
| 2007/0042119 | A1* | 2/2007 | Matthysse et al. | 427/248.1 |
| 2007/0099379 | A1* | 5/2007 | Choi et al. | 438/257 |

FOREIGN PATENT DOCUMENTS

| CN | 1469490 A | 1/2004 |
|---|---|---|
| JP | 7-76778 | 3/1995 |
| JP | 2001-102326 | 4/2001 |
| JP | 2004-79931 | 3/2004 |
| JP | 2004-88078 | 3/2004 |
| JP | 3698163 | 7/2005 |
| JP | 2006-13490 | 1/2006 |
| JP | 2006-182709 | 7/2006 |
| JP | 2008-240119 | 10/2008 |
| KR | 2002-0091595 | 12/2002 |

OTHER PUBLICATIONS

Korean Office Action issued on Jun. 7, 2011 for Application No. 10-2008-0023621 with English translation.

(Continued)

*Primary Examiner* — Joseph Miller, Jr.
(74) *Attorney, Agent, or Firm* — Smith, Gambrell & Russell, LLP (57) ABSTRACT A film formation method for forming a metal oxide film includes loading a target object into a process container configured to maintain a vacuum therein; supplying a film formation source material into the process container; supplying an oxidizing agent into the process container; and causing the film formation source material and the oxidizing agent to react with each other, thereby forming a metal oxide film on the target object. The film formation source material is an organic metal compound containing a metal of the metal oxide film and prepared by mixing a first organic metal compound that is solid at room temperature and has a higher vapor pressure with a second organic metal compound that is liquid at room temperature such that the organic metal compound is liquid at room temperature.

20 Claims, 6 Drawing Sheets

(56) References Cited

OTHER PUBLICATIONS

Japanese Office Action issued on Nov. 22, 2011 for Application No. 2009-241985 with English translation.

Chinese Office Action issued on Mar. 16, 2011 for Application No. 200810085803.6w/ English language translation.

Becker et al., Chem. Matter, 2004, 16, 3497-3501.

* cited by examiner

| TEMAH ratio | State of mixture | | |
|---|---|---|---|
| | 5°C | 15±1°C | 20±1°C |
| 55% | Liquid | Liquid | Liquid |
| 50% | Liquid | Liquid | Liquid |
| 28% | Solid | Liquid | Liquid |
| 15% | Solid | Liquid | Liquid |
| 10% | Solid | Liquid | Liquid |
| 5% | Solid | Liquid | Liquid |

FIG.9

FILM FORMATION METHOD FOR FORMING HAFNIUM OXIDE FILM

CROSS REFERENCE TO RELATED APPLICATION

This application is a division of Ser. No. 12/073,570, filed Mar. 6, 2008, which is being incorporated in its entirety herein by reference.

BACKGROUND OF THE INVENTION

1. Field of the Invention

The present invention relates to a film formation source material, film formation method, and film formation apparatus for forming a metal oxide film, such as an $HfO_2$ film, on a target object, such as a semiconductor wafer, and particularly a technique utilized for the filed of semiconductor processes. The term "semiconductor process" used herein includes various kinds of processes which are performed to manufacture a semiconductor device or a structure having wiring layers, electrodes, and the like to be connected to a semiconductor device, on a target object, such as a semiconductor wafer or a glass substrate used for an FPD (Flat Panel Display), e.g., an LCD (Liquid Crystal Display), by forming semiconductor layers, insulating layers, and conductive layers in predetermined patterns on the target object.

2. Description of the Related Art

In recent years, owing to the demands for increased integration and operation speed of LSIs, the design rule of semiconductor devices for constituting LSIs has increasingly been miniaturized. Along with this trend, CMOS devices needs to have a thinner gate insulating film, and thus the material of gate insulating films are required to have a higher dielectric constant. Further, DRAMs are required to have a capacitor with a higher capacity and a dielectric film with a higher dielectric constant.

On the other hand, flash memories are required to improve the reliability, so the insulating film interposed between the control gate and floating gate thereof needs to have a higher dielectric constant.

As a high dielectric constant material applicable to this purpose, a hafnium oxide ($HfO_2$) film has been examined. Conventionally, a hafnium oxide film is formed by CVD (MOCVD) using an organic metal source material, and tetrakisethylmethylamino hafnium (TEMAH) is used as a source material gas in general (for example, see Jpn. Pat. No. 3,698,163). TEMAH is highly reactive with oxidizing gases and easy to use because this substance is liquid at room temperature (25° C.)

BRIEF SUMMARY OF THE INVENTION

An object of the present invention is to provide a film formation source material for forming a metal oxide film on a target object, wherein the material has a sufficient vapor pressure and is less troubled for line transportation Another object of the present invention is to provide a film formation method and film formation apparatus that employ the film formation source material.

According to a first aspect of the present invention, there is provided a film formation source material for forming a metal oxide film on a target object, wherein the film formation source material is an organic metal compound containing a metal of the metal oxide film and prepared by mixing a first organic metal compound that is solid at room temperature and has a higher vapor pressure with a second organic metal compound that is liquid at room temperature such that the organic metal compound is liquid at room temperature.

According to a second aspect of the present invention, there is provided a film formation method for forming a metal oxide film, the film formation method comprising: loading a target object into a process container configured to maintain a vacuum therein; supplying a film formation source material into the process container; supplying an oxidizing agent into the process container; and causing the film formation source material and the oxidizing agent to react with each other, thereby forming a metal oxide film on the target object, wherein the film formation source material is an organic metal compound containing a metal of the metal oxide film and prepared by mixing a first organic metal compound that is solid at room temperature and has a higher vapor pressure with a second organic metal compound that is liquid at room temperature such that the organic metal compound is liquid at room temperature.

According to a third aspect of the present invention, there is provided a film formation apparatus for forming a metal oxide film on target objects, the film formation apparatus comprising: a process container having a vertical and cylindrical shape and configured to maintain a vacuum therein; a holder configured to hold the target objects stacked at intervals inside the process container; a heating device disposed around the process container; a film formation source material supply mechanism configured to supply a film formation source material into the process container, wherein the film formation source material is an organic metal compound containing a metal of the metal oxide film and prepared by mixing a first organic metal compound that is solid at room temperature and has a higher vapor pressure with a second organic metal compound that is liquid at room temperature such that the organic metal compound is liquid at room temperature; an oxygen-containing gas supply mechanism configured to supply an oxygen-containing gas into the process container; and a control mechanism configured to control supply of the film formation source material and the oxygen-containing gas.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

In the process of developing the present invention, the inventors studied problems of conventional techniques for forming a high dielectric constant material film. As a result, the inventors have arrived at the findings given below.

Where a hafnium oxide film is formed by use of TEMAH as disclosed in Jpn. Pat. No. 3,698,163, a lot of particles are unfavorably generated. This is due to the fact that, although TEMAH has a vapor pressure relatively higher among liquid materials of this kind, the vapor pressure is still insufficient. Accordingly, where TEMAH is used, a vaporizing temperature that exceeds the thermal decomposition temperature needs to be used to generate a necessary amount of gas, but this brings about particle generation due to re-liquefaction, thermal decomposition, and so forth. Further, since the vapor pressure of TEMAH is insufficient, TEMAH needs time to be desorbed from process tubes and lines and is poor in film thickness uniformity obtained by a CVD reaction.

Under the circumstances, owing to the demands for a source material having a higher vapor pressure and thus being easier to vaporize, a study is made on tetrakisdimethylamino hafnium (TDMAH). However, TDMAH is solid at room temperature (25° C.) and thus is not easy to use. Further, TDMAH needs to be supplied through lines constantly heated, and thus may damage lines and/or valves by solidification when heating is insufficient due to failure of power supply.

However, it has been found that, where TDMAH is mixed with TEMAH, the source material can be liquid at room temperature while taking advantage of the higher vapor pressure of TDMAH. In other words, where an organic metal compound containing a metal of a metal oxide film to be formed is used as a film formation source material, a first organic metal compound that is solid at room temperature and has a higher vapor pressure is mixed with a second organic metal compound that is liquid at room temperature, so that the film formation source material is liquid at room temperature and has an advantage associated with the higher vapor pressure of the first organic metal compound.

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

Figure 1:
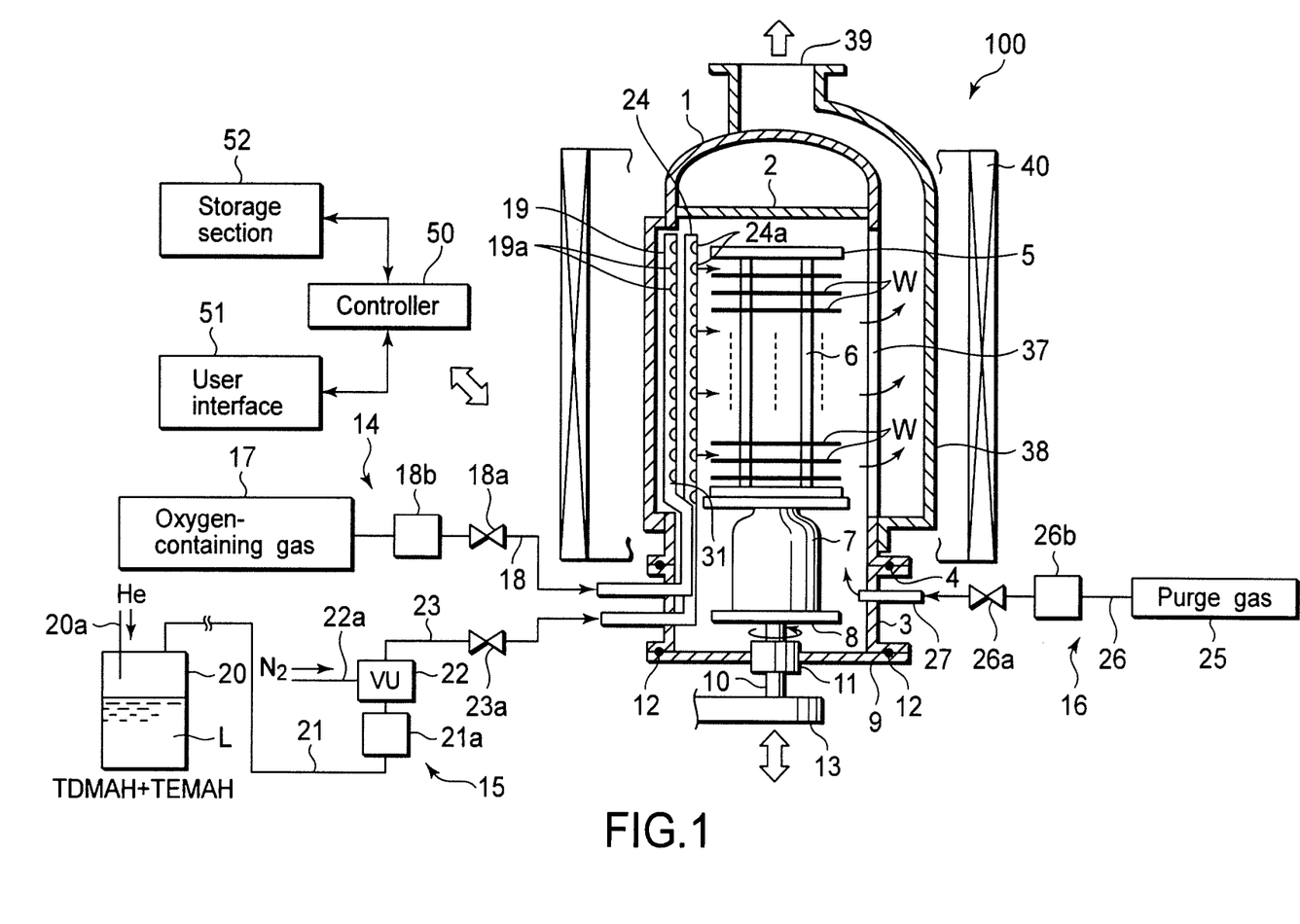
FIG. 1 is a sectional front view showing a film formation apparatus for performing a film formation method according to an embodiment of the present invention.
Figure 2:
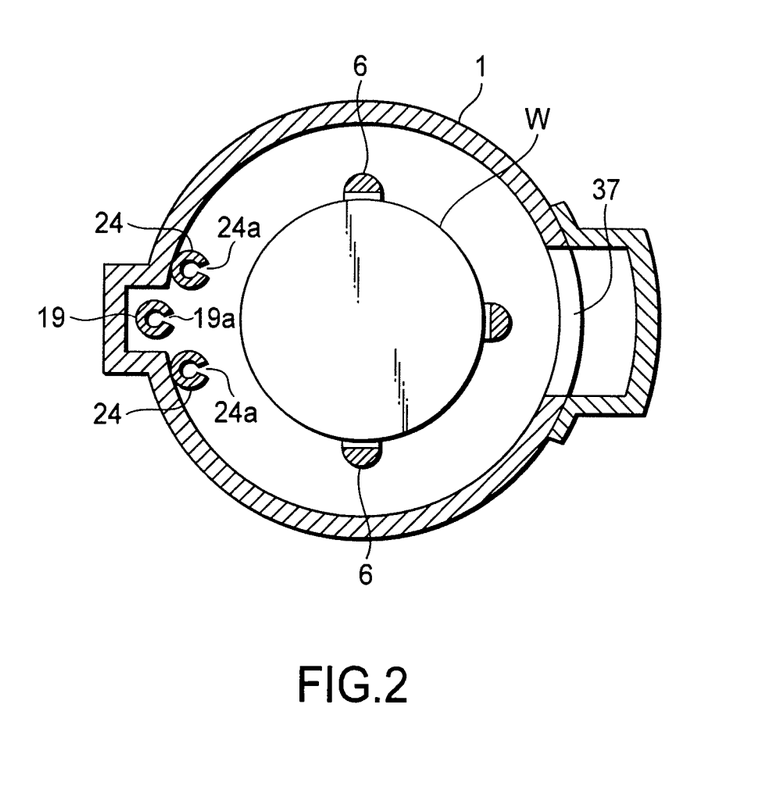
FIG. 2 is a sectional plan view showing part of the film formation apparatus shown in FIG. 1.
Figure 3:
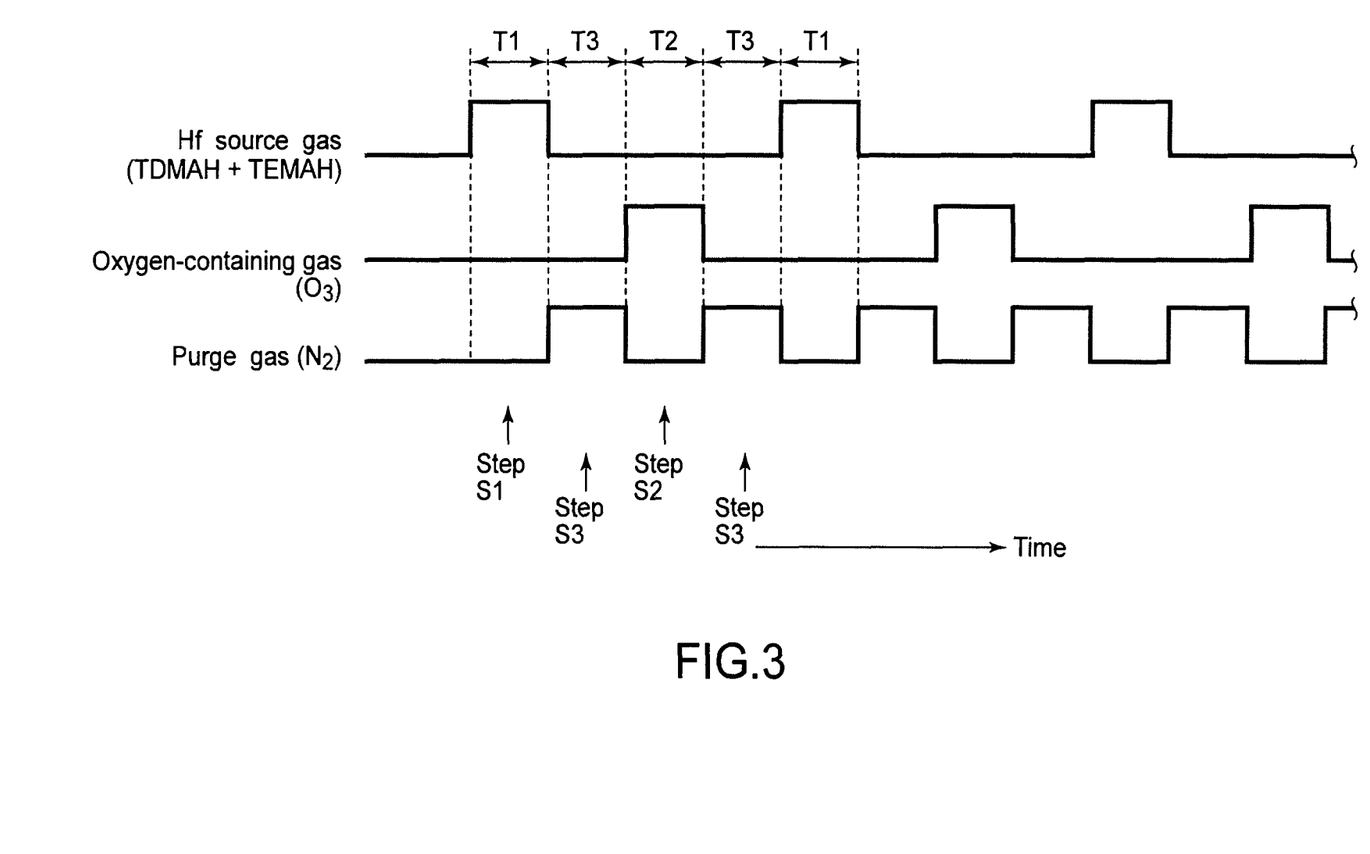
FIG. 3 is a timing chart showing the gas supply of a film formation method according to an embodiment of the present invention.

FIG. 1 is a sectional front view showing a film formation apparatus for performing a film formation method according to an embodiment of the present invention. FIG. 2 is a sectional plan view showing part of the film formation apparatus shown in FIG. 1. FIG. 3 is a timing chart showing the gas supply of a film formation method according to an embodiment of the present invention. In FIG. 2, a heating device is not shown.

The film formation apparatus 100 includes a process container 1 shaped as a cylindrical column with a ceiling and an opened bottom. The entirety of the process container 1 is made of, e.g., quartz. The top of the process container 1 is provided with a quartz ceiling plate 2 to airtightly seal the top. The opened bottom of the process container 1 is connected through a seal member 4, such as an O-ring, to a cylindrical manifold 3 made of, e.g., stainless steel.

The manifold 3 supports the bottom of the process container 1. A wafer boat 5 made of quartz is moved up and down through the bottom port of the manifold 3, so that the wafer boat 5 is loaded/unloaded into and from the process container 1. A number of, such as about 50 to 100, target objects or semiconductor wafers W are stacked on a wafer boat 5. The wafer boat 5 has three struts 6 (see FIG. 2) with grooves on which a number of wafers W are respectively supported.

The wafer boat 5 is placed on a table 8 through a heat-insulating cylinder 7 made of quartz. The table 8 is supported by a rotary shaft 10, which penetrates a lid 9 made of, e.g., stainless steel, and used for opening/closing the bottom port of the manifold 3.

The portion of the lid 9 where the rotary shaft 10 penetrates is provided with, e.g., a magnetic-fluid seal 11, so that the rotary shaft 10 is rotatably supported in an airtightly sealed state. A seal member 12, such as an O-ring, is interposed between the periphery of the lid 9 and the bottom of the manifold 3, so that the interior of the process container 1 can be kept sealed.

For example, the rotary shaft 10 is attached at the distal end of an arm 13 supported by an elevating mechanism (not shown), such as a boat elevator. The elevating mechanism moves the wafer boat 5 and lid 9 up and down in unison into and from the process container 1. The table 8 may be fixed to the lid 9, so that wafers W are processed without rotation of the wafer boat 5.

A film formation apparatus 100 includes an oxygen-containing gas supply mechanism 14, an Hf source gas supply mechanism 15, and a purge gas supply mechanism 16, which are connected to the side of the manifold 3. The oxygen-containing gas supply mechanism 14 is arranged to supply an oxygen-containing gas, such as $O_3$ gas, into the process container 1. The Hf source gas supply mechanism 15 is arranged to supply an Hf source gas into the process container 1. The purge gas supply mechanism 16 is arranged to supply an inactive gas, such as $N_2$ gas, used as a purge gas into the process container 1.

The oxygen-containing gas supply mechanism 14 includes an oxygen-containing gas supply source 17 and an oxygen-containing gas distribution nozzle 19 connected to each other through an oxygen-containing gas line 18, so that an oxygen-containing gas is supplied from the gas supply source 17 through the gas line 18 to the gas distribution nozzle 19. The oxygen-containing gas distribution nozzle 19 is formed of a quartz pipe which penetrates the sidewall of the manifold 3 from the outside and then turns and extends vertically upward. The vertical portion of the oxygen-containing gas distribution nozzle 19 has a plurality of gas spouting holes 19a formed thereon at predetermined intervals, so that the oxygen-containing gas, such as $O_3$ gas, is almost uniformly delivered in the horizontal direction from the gas spouting holes 19a toward the process container 1.

The Hf source gas supply mechanism 15 includes an Hf source reservoir 20 that stores an Hf source liquid L used as a film formation source material and a vaporizer 22 for vaporizing the Hf source liquid connected to each other through an Hf source line 21, so that the Hf source liquid is supplied from the source reservoir 20 through the source line 21 to the vaporizer 22. The vaporizer 22 is connected to Hf source gas distribution nozzles 24 through Hf source gas lines 23, so that the generated Hf source gas is supplied from the vaporizer 22 through the gas lines 23 to the gas distribution nozzles 24. Each of the Hf source gas distribution nozzles 24 is formed of a quartz pipe which penetrates the sidewall of the manifold 3 from the outside and then turns and extends vertically upward. In this embodiment, two Hf source gas distribution nozzles 24 are disposed one on either sides of the oxygen-containing gas distribution nozzle 19 (see FIG. 2). Each of the Hf source gas distribution nozzles 24 has a plurality of gas spouting holes 24a formed thereon at predetermined intervals in the longitudinal direction, so that the Hf source gas is almost uniformly delivered in the horizontal direction from the gas spouting holes 24a toward the process container 1. Only one Hf source gas distribution nozzle 24 may be disposed for this purpose.

The purge gas supply mechanism 16 includes a purge gas supply source 25 and a purge gas nozzle 27 connected to each other through a purge gas line 26, so that a purge gas is supplied from the gas supply source 25 through the gas line 26 to the gas nozzle 27. The purge gas nozzle 27 is formed of a short quartz pipe which penetrates the sidewall of the manifold 3 from the outside. The purge gas is preferably an inactive gas, such as $N_2$ gas.

The oxygen-containing gas line 18 is provided with a switching valve 18a and a flow rate controller 18b, such as a mass flow controller, so that the oxygen-containing gas can be supplied at a controlled flow rate. The purge gas line 26 is provided with a switching valve 26a and a flow rate controller 26b, such as a mass flow controller, so that the purge gas can be supplied at a controlled flow rate.

An Hf source pressurizing line 20a is inserted into the Hf source reservoir 20 to supply a pressurized gas, such as He gas, therethrough, so that the Hf source liquid is supplied from the Hf source reservoir 20 to the Hf source line 21. The Hf source line 21 is provided with a flow rate controller 21a, such as a liquid mass flow controller, and each of the Hf source gas lines 23 is provided with a valve 23a.

In this embodiment, the Hf source is a mixture of a first organic metal compound that is solid at room temperature and has a higher vapor pressure and a second organic metal compound that is liquid at room temperature, so that the Hf source is liquid at room temperature as a whole. Specifically, the first organic metal compound is tetrakisdimethylamino hafnium (TDMAH), while the second organic metal compound is tetrakisethylmethylamino hafnium (TEMAH). As the second organic metal compound, tetrakisdiethylamino hafnium (TDEAH) may be used in place of TEMAH.

On the other hand, on the side of the process container 1 opposite to the oxygen-containing gas distribution nozzle 19 and Hf source gas distribution nozzles 24, the process container 1 has an exhaust port 37 formed thereon for vacuum-exhausting the interior of the process container 1. The exhaust port 37 has a long and thin shape formed by cutting the sidewall of the process container 1 in the vertical direction. The exhaust port 37 is covered with an exhaust port cover member 38 having a U-shape cross-section, and attached to the process container 1 by welding. The exhaust port cover member 38 extends upward along the sidewall of the process container 1, and has a gas outlet 39 at the top of the process container 1. The gas outlet 39 is connected to a vacuum-exhaust mechanism (not shown) including a vacuum pump and so forth. The process container 1 is surrounded by a cylindrical heating device 40 for heating the atmosphere and wafers W inside the process container 1.

The film formation apparatus 100 includes a controller 50 comprising a microprocessor (computer), which controls the respective components in the film formation apparatus 100. For example, the controller 50 controls the valves 18a, 23a, and 26a to supply/stop the gases by opening/closing them, the flow rate controllers 18b, 21a, and 26b to adjust the flow rates of the gases and source liquid, and the heating device 40. The controller 50 is connected to the user interface 51, which includes, e.g., a keyboard and a display, wherein the keyboard is used for an operator to input commands for operating the film formation apparatus 100, and the display is used for showing visualized images of the operational status of the film formation apparatus 100.

Further, the controller 50 is connected to a storage section 52 that stores recipes, i.e., control programs for the controller 50 to control the film formation apparatus 100 so as to perform various processes, and control programs for the respective components of the film formation apparatus 100 to perform processes in accordance with process conditions. The recipes are stored in a storage medium included in the storage section 52. The storage medium may be formed of a medium of the stationary type, such as a hard disk or semiconductor memory, or a medium of the portable type, such as a CDROM, DVD, or flash memory. Alternatively, the recipes may be used online while they are transmitted from another apparatus through, e.g., a dedicated line, as needed.

A required recipe is retrieved from the storage section 52 and executed by the controller 50 in accordance with an instruction or the like input through the user interface 51. Consequently, the film formation apparatus 100 can perform a predetermined process under the control of the controller 50.

Next, an explanation will be given of a film forming method according to an embodiment performed in the film formation apparatus having the structure described above, with reference to FIG. 3. The following explanation will be exemplified by a case where the Hf source gas and oxygen-containing gas are alternately supplied a plurality of times to form an $HfO_2$ film on semiconductor wafers W.

At first, the wafer boat 5 at room temperature, which supports a number of, such as 50 to 100, wafers, is loaded from below into the process container 1 heated at a predetermined temperature. Then, the bottom port of the manifold 3 is closed by the lid 9 to set an airtight space inside the process container 1. For example, the semiconductor wafers W have a diameter of 300 mm.

Then, the interior of the process container 1 is vacuum-exhausted and kept at a predetermined process pressure. Further, the electric power applied to the heating device 40 is controlled to increase and set the wafer temperature to a process temperature. Then, while the wafer boat 5 is rotated, the film formation process is started.

As shown in FIG. 3, the film formation process is arranged to alternately repeat Step S1 of adsorbing the Hf source gas, and Step S2 of supplying an oxygen-containing gas, such as $O_3$ gas, into the process container 1 to oxidize the Hf source gas, with Step S3 interposed therebetween for removing residual gas from inside the process container 1. At this time, the process temperature is set to be 100 to 400° C.

Specifically, the Hf source reservoir 20 of the Hf source gas supply mechanism 15 stores the Hf source prepared by mixing a first organic metal compound TDMAH that is solid at room temperature and has a higher vapor pressure and a second organic metal compound TEMAH that is liquid at room temperature, so that the Hf source is liquid at room temperature as a whole. In Step S1, the Hf source supplied from the Hf source reservoir 20 is vaporized by the vaporizer 22 to generate an Hf source gas, which is supplied through the Hf source gas lines 23 and Hf source gas distribution nozzles 24 and is delivered from the gas spouting holes 24a into the process container 1 for a period T1. Consequently, the Hf source is adsorbed on the semiconductor wafers. The period T1 is set to be, e.g., 1 to 60 sec. The flow rate of the Hf source gas is set to be, e.g., 0.2 to 1.0 mL/min (sccm). The pressure inside the process container 1 is set to be, e.g., 13 to 133 Pa.

Of the Hf sources, TDMAH has a molecular weight of 354.79, a vaporizing point of 48° C. at 0.1 Torr (13.3 Pa), and a melting point of 28° C., and this source material is solid at room temperature. On the other hand, TEMAH has a molecular weight of 410.90, a vaporizing point of 83° C. at 0.1 Torr (13.3 Pa), and this source material is liquid at room temperature.

TDMAH has a higher vapor pressure than those of Hf sources, such as TEMAH, which are liquid at room temperature, so TDMAH is preferable to solve problems caused by liquid source materials having a low vapor pressure. However, TDMAH is solid at room temperature and thus is not easy to use. Further, TDMAH needs to be supplied through lines constantly heated, and thus may damage lines and/or valves by solidification when heating is insufficient due to failure of power supply.

In light of this, according to this embodiment, TDMAH that is solid at room temperature is mixed with TEMAH that is liquid at room temperature, so that the source material is liquid at room temperature and has an advantage associated with the higher vapor pressure of TDMAH. TDMAH is solid at room temperature, but is relatively easily liquefied, such that, where TDMAH is mixed with a small amount of TEMAH, the material is liquid at room temperature.

Specifically, the mixture ratio is preferably 50 mass % or less of TEMAH that is liquid at room temperature relative to 100 mass % of TDMAH that is solid at room temperature. If TEMAH exceeds 50 mass %, although the source material is liquid at room temperature, it is difficult to sufficiently take advantage of the higher vapor pressure of TDMAH. TEMAH is mixed to cause the Hf source to be liquid at room temperature as a whole, and an increase in the amount of TEMAH lowers the vapor pressure. Accordingly, as long as the source material can stably remain liquid at room temperature, the amount of TEMAH is preferably smaller. In light of this, TEMAH is preferable set at 10 mass % or less relative to 100 mass % of TDMAH. However, if TEMAH is less than 5 mass %, the source material may be unable to stably remain liquid at room temperature. In conclusion, TEMAH is preferable set to be 5 to 10 mass %.

As described previously, TDEAH may be used as a second organic metal compound that is liquid at room temperature, in place of TEMAH. TDEAH has a lower vapor pressure than TEMAH, but a mixture of TDMAH with a suitable amount of TDEAH can provide an Hf source that is liquid at room temperature and has an advantage associated with the higher vapor pressure of TDMAH. In this case, the mixture ratio of TDEAH relative to 100 mass % of TDMAH is preferably set to be 55 mass % or less, more preferably to be 10 mass % or less, and much more preferably to be 5 to 10 mass %.

In Step S2 of supplying oxygen radicals, the oxygen-containing gas, such as $O_3$ gas, is supplied from the oxygen-containing gas supply source 17 of the oxygen-containing gas supply mechanism 14 through the oxygen-containing gas line 18 and oxygen-containing gas distribution nozzle 19, and is delivered from the gas spouting holes 19a. Consequently, the Hf source adsorbed on the semiconductor wafers W is oxidized, and an $HfO_2$ film is thereby formed. The period T2 of this process is set to be, e.g., 1 to 300 sec. The flow rate of the oxygen-containing gas is set to be, e.g., 1,000 to 25,000 mL/min (sccm), although it depends on the number of loaded semiconductor wafers W. The pressure inside the process container 1 is set to be, e.g., 13 to 266 Pa.

In place of $O_3$ gas, $O_2$ gas, $NO_2$ gas, NO gas, $N_2O$ gas, or $H_2O$ gas may be used as an oxygen-containing gas. A plasma generating mechanism may be disposed to turn the oxygen-containing gas into plasma to enhance the reactivity. Where $O_3$ gas is used, the oxygen-containing gas supply source 17 is provided with an ozonizer to generate $O_3$ gas.

Step S3 performed between the Steps S1 and S2 or between Steps S2 and S1 is a step of removing residual gas from inside the process container 1 after Step S1 or Step S2, so as to allow a predetermined reaction to be caused in the next step. Specifically, the interior of the process container 1 is vacuum-exhausted, while an inactive gas, such as $N_2$ gas, used as a purge gas, is supplied from the purge gas supply source 23 of the purge gas supply mechanism 16 through the purge gas line 24 and purge gas nozzle 25. The period T3 of Step S3 is set to be, e.g., 5 to 180 sec. The flow rate of the purge gas is set to be, e.g., 500 to 15,000 mL/min (sccm). Step S3 may be arranged to continuously perform only vacuum-exhaust while shutting off all the gases including the purge gas, if this operation can remove residual gas from inside the process container 1. However, where the purge gas is supplied, it is possible to remove residual gas from inside the process in a shorter time. At this time, the pressure inside the process container 1 is set to be, e.g., 0.1 to 266 Pa.

As described above, the Hf source gas and oxygen-containing gas are alternately and intermittently supplied a plurality of times with Step S3 interposed therebetween for removing residual gas from inside the process container 1. Consequently, thin films of $HfO_2$ formed by respective times are laminated, thereby arriving at an $HfO_2$ film having a predetermined thickness.

Since the film is formed by alternately supplying the gases, the reactivity of the process is enhanced so that the film formation can be performed at a lower temperature. Further, since TDMAH that is inherently a solid source material and has a higher vapor pressure is mixed with TEMAH or TDEAH that is a liquid source material, it is possible to realize an Hf source that is liquid at room temperature and has a higher vapor pressure. Where the Hf source is liquid at room temperature, the Hf source is easy to use without problems caused by source materials that are solid at room temperature. In addition, the Hf source has a higher vapor pressure than TEMAH, so it is possible to solve problems of TEMAH such that a vaporizing temperature that exceeds the thermal decomposition temperature needs to be used and it takes a long time to be desorbed from process tubes and lines. Further, the gas mobility is increased and thereby improves the film thickness uniformity obtained by a CVD reaction.

Next, an explanation will be given of basic experiments performed in the process of developing the present invention.

Figure 4:
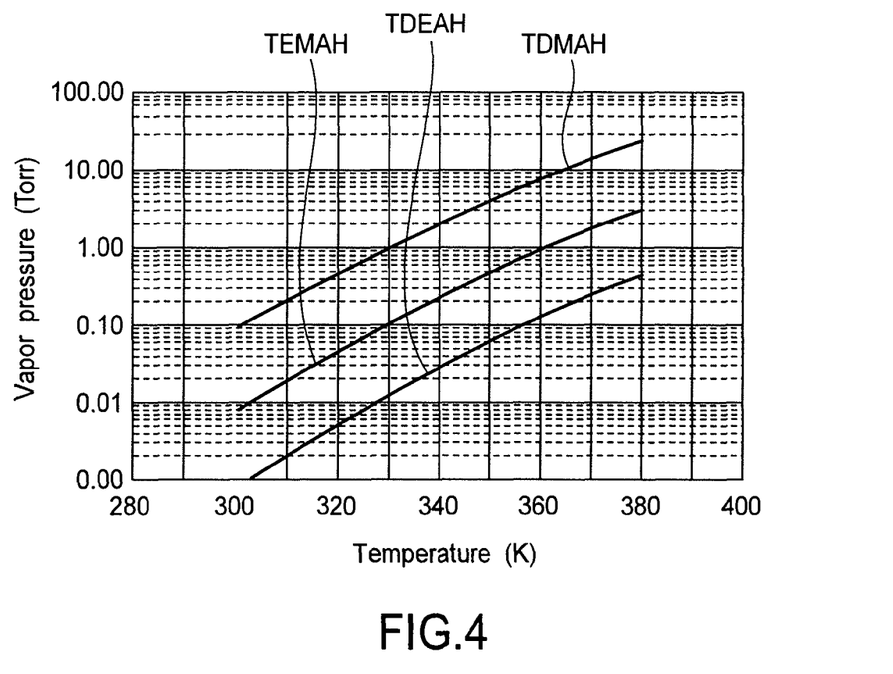
FIG. 4 is a view showing the vapor pressure characteristic lines of TEMAH, TDEAH, and TDMAH.

FIG. 4 is a view showing the vapor pressure characteristic lines of TEMAH, TDEAH, and TDMAH. As shown in FIG. 4, TDMAH has the highest vapor pressure and thus is easiest to evaporate. On the other hand, TEMAH and TDEAH that are liquid at room temperature have lower vapor pressures and thus are uneasy to evaporate, as compared to TDMAH.

Figure 5:
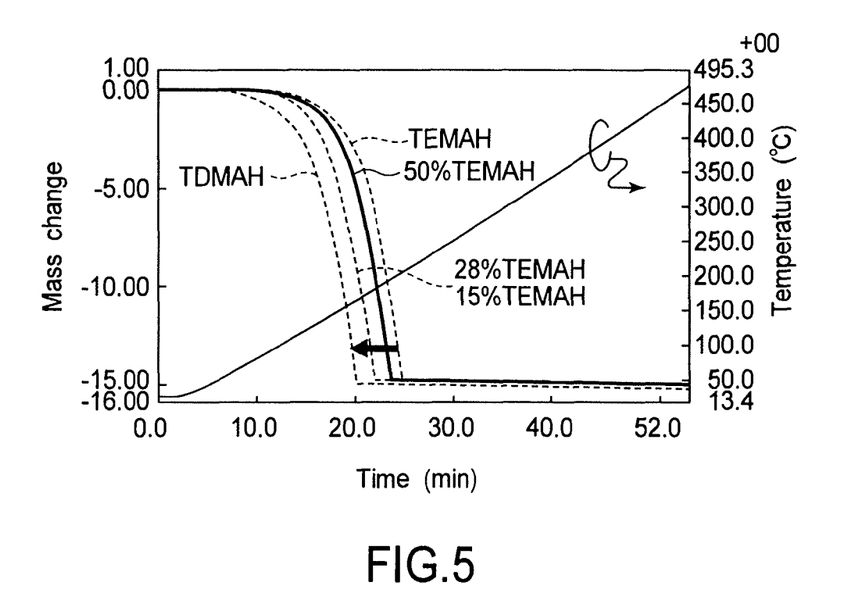
FIG. 5 is a view showing the mass changes due to evaporation of TDMAH mixed with TEMAH at different ratios.
Figure 6:
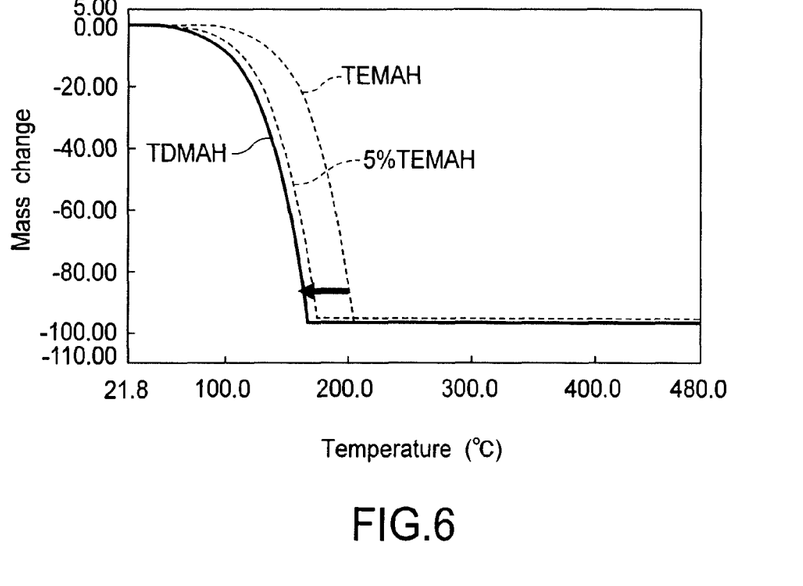
FIG. 6 is a view showing the mass changes due to evaporation of TDMAH, TEMAH, and TDMAH mixed with TEMAH at 5 mass %.

Experiments were conducted to examine the evaporation property of TDMAH, TEMAH, and mixtures thereof at different mixture ratios. In the experiments, measurement was made on the mass changes due to evaporation of TDMAH mixed with TEMAH at different ratios. FIGS. 5 and 6 show results of the experiments. FIG. 5 is a view showing TG-GTA characteristic lines that represent the relationship between the time and mass change where the temperature was increased at a constant rate. FIG. 6 is a view showing the relationship between the temperature and mass change, converted from the relationship shown in FIG. 5. As shown in FIG. 5, with a decrease in the amount of TEMAH, the evaporation property of the mixture became closer to that of TDMAH. As shown in FIG. 6, where TEMAH was set at 5 mass %, the evaporation property of the mixture became very close to that of TDMAH.

Figure 7:
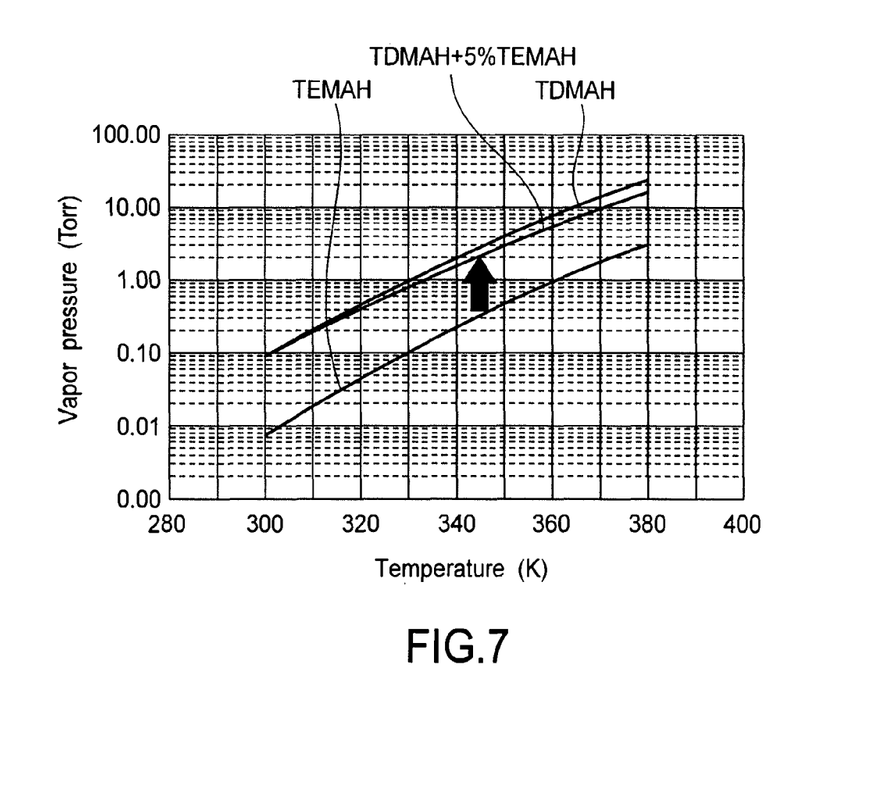
FIG. 7 is a view showing the vapor pressure characteristic lines of TDMAH, TEMAH, and TDMAH mixed with TEMAH at 5 mass %.

FIG. 7 is a view showing the vapor pressure characteristic lines of TDMAH, TEMAH, and TDMAH mixed with TEMAH at 5 mass %. As shown in FIG. 7, the vapor pressure characteristic line of TDMAH mixed with TEMAH at 5 mass % was very close to the vapor pressure characteristic line of TDMAH.

Figure 9:
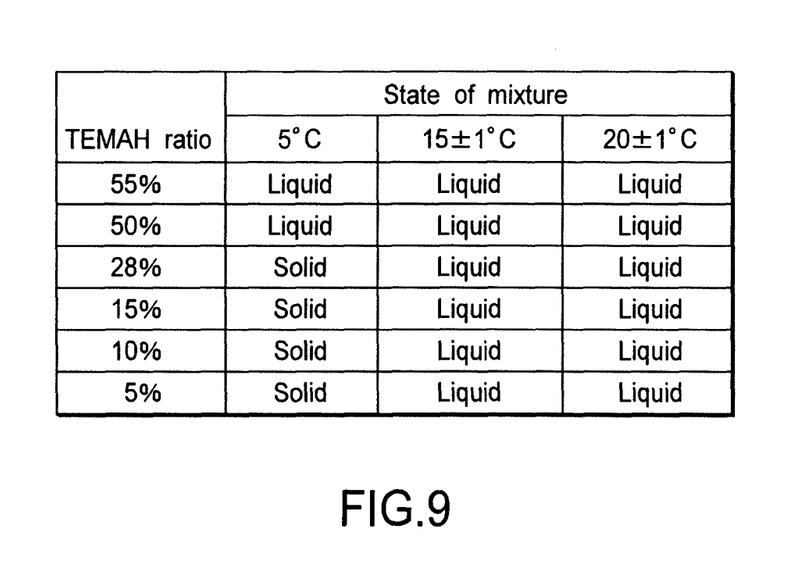
FIG. 9 is a diagram showing the states of TDMAH mixed with TEMAH at 5 to 55 mass % under temperatures of 5° C., 15±1° C., and 20±1° C.

Then, an experiment was conducted to examine the states of TDMAH mixed with TEMAH at 5 to 55 mass % under temperatures of 5° C., 15±1° C., and 20±1° C. FIG. 9 shows results of this experiment. As shown in FIG. 9, at 5° C., mixtures with TEMAH at 28 mass % or less were solid. At 15±1° C. and 20±1° C., all the mixtures with TEMAH at 5 mass % or more were liquid. In other words, it has been confirmed that mixing merely 5 mass % of TEMAH can provide an Hf source that is liquid at room temperature. In order to obtain a high vapor pressure, the amount of TEMAH should be as low as possible. However, where a more stable liquid is required depending on use conditions, the amount of TEMAH may be suitably increased.

Next, an explanation will be given of results of film formation actually performed according to an embodiment of the present invention.

In this experiment, an $HfO_2$ film was formed in accordance with a present example using TDMAH mixed with TEMAH at 5 mass % as an Hf source, and a comparative example using TEMAH solely as an Hf source.

In this experiment, 100 wafers of 300 mm were loaded into the process container, and the film formation temperature was set to be 150 to 400° C. Step S1 was performed for 60 sec with an Hf source supplied at a liquid flow rate of 0.1 to 1 mL/min, and a pressure set at 65 Pa. Step S2 was performed for 60 sec with $O_3$ gas used as an oxidizing agent supplied at a flow rate of 200 g/Nm$^3$, and a pressure of 133 Pa. Steps S1 and S2 with purge Step S3 interposed therebetween were alternately repeated 15 times to form an $HfO_2$ film. In order to purge the interior of the process container, before Step S1, the interior of the process container was kept vacuum-exhausted while $N_2$ gas was supplied as a purge gas at a flow rate of 2,000 mL/min (sccm) for 15 sec. Further, before Step S2, the interior of the process container was kept vacuum-exhausted while $N_2$ gas was supplied as a purge gas at a flow rate of 2,000 mL/min (sccm) for 120 sec.

Figure 8:
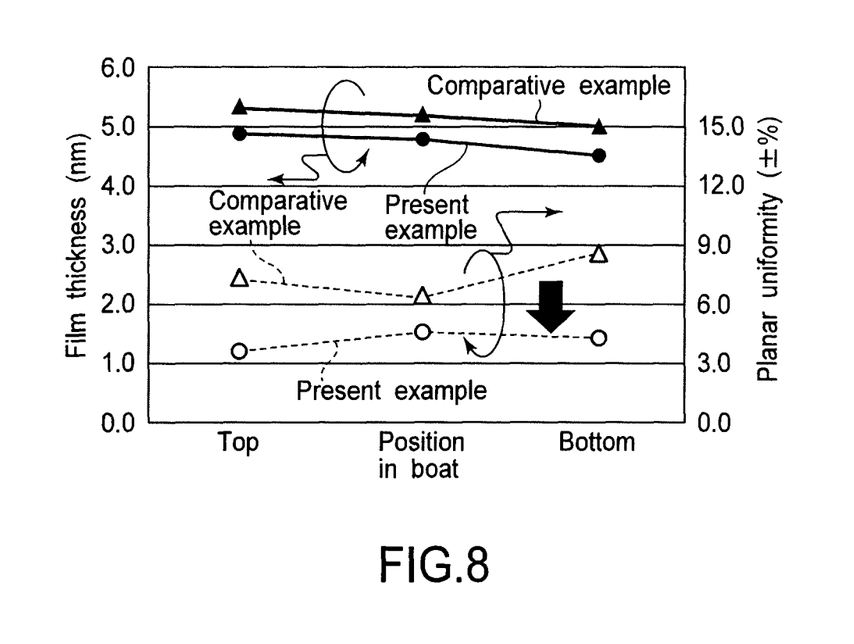
FIG. 8 is a view showing some results of a film formation experiment performed by use of an Hf source according to an embodiment of the present invention and a conventional Hf source.

FIG. 8 is a view showing some results of the experiment, concerning the average value of the film thickness and variations of the film thickness. As shown in FIG. 8, the present example using an Hf source with a high vapor pressure rendered smaller variations in both of the wafer planar uniformity and inter-wafer uniformity, as compared to the comparative example. Since the film formation uniformity is high, this method is particularly suitable for a case where an $HfO_2$ film is formed as a dielectric film on a cylinder with a high aspect ratio used as a capacitor of a DRAM.

According to the embodiment of the present invention, where an organic metal compound containing a metal of a metal oxide film to be formed is used as a film formation source material, a first organic metal compound that is solid at room temperature and has a higher vapor pressure is mixed with a second organic metal compound that is liquid at room temperature, such that the organic metal compound used as the film formation source material is liquid at room temperature. Consequently, it is possible to solve problems caused by a source material that is solid at room temperature, while taking advantage of the higher vapor pressure of the first organic metal compound.

The present invention is not limited to the embodiment described above, and it may be modified in various manners. For example, in the embodiment described above, the present invention is applied to a film formation apparatus of the batch type configured to load a plurality of semiconductor wafers and to perform a film formation process thereon all together. Alternatively, the present invention may be applied to a film formation apparatus of the single-wafer type configured to perform a film formation process on wafers one by one. In the embodiment described above, the film formation source material and oxidizing agent are alternately supplied, but they may be supplied simultaneously.

In the embodiment described above, an $HfO_2$ film is formed by a mixture of tetrakisdimethylamino hafnium (TDMAH) with tetrakisethylmethylamino hafnium (TEMAH) or tetrakisdiethylamino hafnium (TDEAH). Almost the same effects can be obtained in a case where a $ZrO_2$ film is formed by a mixture of tetrakisdimethylamino zirconium (TDMAZ) with tetrakisethylmethylamino zirconium (TEMAZ) or tetrakisdiethylamino zirconium (TDEAZ).

Further, the present invention may be generally applied to a case where a film formation source material that is liquid at room temperature and has a high vapor pressure is prepared for a metal oxide film by mixing a film formation source material that is solid at room temperature and has a higher vapor pressure with a film formation source material that is liquid at room temperature.

In the embodiment described above, the Hf source gas and oxygen-containing gas are alternately supplied. Alternatively, the oxygen-containing gas may be supplied simultaneously with the Hf source gas. Further, the Hf source gas and oxygen-containing gas may be continuously supplied, as in ordinary CVD film formation.

The target object is not limited to a semiconductor wafer, and the present invention may be applied to another substrate, such as an LCD glass substrate.

The present invention is widely usable for dielectric films included in semiconductor devices, such as the capacitor dielectric film of a DRAM, the gate insulating film of a MOS device, such as a CMOS device, and the insulating film interposed between the control gate and floating gate of a flash memory.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:
1. A film formation method for forming a hafnium oxide film by CVD on a target object, the method comprising:
supplying a hafnium source gas onto the target object, while obtaining the hafnium source gas by vaporizing a hafnium source material in liquid phase by a vaporizer;
supplying an oxygen-containing gas onto the target object; and causing the hafnium source gas and the oxygen-containing gas to react with each other so as to deposit hafnium oxide on the target object, wherein the hafnium source material consists of a mixture of a first organic hafnium compound that is solid at room temperature with a second organic hafnium compound that is liquid at room temperature, the first organic hafnium compound having a higher vapor pressure than the second organic hafnium compound, the first organic hafnium compound and the second organic hafnium compound being mixed at a mixture ratio such that the hafnium source material is liquid at room temperature, the first organic hafnium compound is tetrakisdimethylamino hafnium (TDMAH), and the second organic hafnium compound is tetrakisethymethylamino hafnium (TEMAH) or tetrakisdiethylamino hafnium (TDEAH), and in the mixture ratio, the second organic hafnium compound is set to be 5 to 55 mass % relative to 100 mass % of the first organic hafnium compound.

2. The method according to claim 1, wherein said supplying hafnium source gas and said supplying an oxygen-containing gas are alternately repeated a plurality of times.

3. The method according to claim 1, wherein said supplying hafnium source gas and said supplying an oxygen-containing gas are alternately repeated a plurality of times with purging interposed therebetween of exhausting and removing residual gas on the target object without supplying either of the hafnium source gas and the oxygen-containing gas onto the target object.

4. The method according to claim 3, wherein said purging includes supplying a purge gas onto the target object while vacuum-exhausting the residual gas.

5. The method according to claim 1, wherein the second organic hafnium compound is the TEMAH.

6. The method according to claim 5, wherein in the mixture ratio, the second organic metal compound is set to be 5 to 10 mass % or less relative to 100 mass % of the first organic metal compound.

7. The method according to claim 1, wherein the second organic hafnium compound is the TDEAH.

8. The method according to claim 1, wherein the oxygen-containing gas is selected from the group consisting of $O_3$ gas, $O_2$ gas, $NO_2$ gas, NO gas, $N_2O$ gas, and $H_2O$ gas.

9. The method according to claim 1, wherein the method uses a process temperature of 100 to 400° C. in said causing the hafnium source gas and the oxygen-containing gas to react with each other.

10. The method according to claim 1, wherein the method further comprises storing the hafnium source material in liquid phase inside a reservoir and feeding the hafnium source material in liquid phase from the reservoir to the vaporizer.

11. A film formation method for forming a hafnium oxide film by CVD on a target object, the method comprising:

storing a hafnium source material in liquid phase inside a reservoir;

feeding the hafnium source material in liquid phase from the reservoir to a vaporizer;

supplying a hafnium source gas onto the target object, while obtaining the hafnium source gas by vaporizing the hafnium source material in liquid phase by the vaporizer;

supplying an oxygen-containing gas onto the target object; and causing the hafnium source gas and the oxygen-containing gas to react with each other so as to deposit hafnium oxide on the target object, wherein the hafnium source material consists of a mixture of tetrakisdimethylamino hafnium (TDMAH) and tetrakisethylmethylamino hafnium (TEMAH) mixed at a mixture ratio such that the hafnium source material is liquid at room temperature, the TEMAH being set to be 5 to 55 mass % relative to 100 mass % of the TDMAH in terms of the mixture ratio.

12. The method according to claim 11, wherein the TEMAH is set to be 5 to 10 mass % relative to 100 mass % of the TDMAH in terms of the mixture ratio.

13. The method according to claim 11, wherein said supplying hafnium source gas and said supplying an oxygen-containing gas are alternately repeated a plurality of times with purging interposed therebetween of exhausting and removing residual gas on the target object without supplying either of the hafnium source gas and the oxygen-containing gas onto the target object, and said purging includes supplying a purge gas onto the target object while vacuum-exhausting the residual gas.

14. The method according to claim 11, wherein the oxygen-containing gas is selected from the group consisting of $O_3$ gas, $O_2$ gas, and $H_2O$ gas.

15. The method according to claim 11, wherein the method uses a process temperature of 100 to 400° C. in said causing the hafnium source gas and the oxygen-containing gas to react with each other.

16. A film formation method for forming a hafnium oxide film on a plurality of target objects, the method comprising:

preparing a vertical film formation apparatus that includes a process container, a holder configured to hold the target objects at intervals in a vertical direction inside the process container, a first group of gas spouting holes and a second group of gas spouting holes both arrayed along the holder in a vertical direction on a first side of the holder and configured to respectively spout a hafnium source gas and an oxygen-containing gas, an exhaust port disposed along the holder in a vertical direction on a second side of the holder opposite to the first side, a heater disposed around the process container, and a vaporizer configured to generate the hafnium source gas by vaporizing a hafnium source material in liquid phase;

setting a state where the holder with the target objects held thereon is loaded in the process container;

supplying the hafnium source gas onto the target objects on the holder by spouting the hafnium source gas in lateral directions from the first group of gas spouting holes while exhausting gas from inside the process container through the exhaust port and generating the hafnium source gas from the hafnium source material by the vaporizer;

supplying the oxygen-containing gas onto the target objects on the holder by spouting oxygen-containing gas in lateral directions from the second group of gas spouting holes while exhausting gas from inside the process container through the exhaust port; and heating the process container by the heater to activate the hafnium source gas and the oxygen-containing gas and to cause the hafnium source gas and the oxygen-containing gas to react with each other so as to deposit hafnium oxide on the target objects, wherein the hafnium source material consists of a mixture of a first organic hafnium compound that is solid at room temperature with a second organic hafnium compound that is liquid at room temperature, the first organic hafnium compound having a higher vapor pressure than the second organic hafnium compound, the first organic hafnium compound and the second organic hafnium compound being mixed at a mixture ratio such that the hafnium source material is liquid at room temperature, the first organic hafnium compound is tetrakisdimethylamino hafnium (TDMAH), and the second organic hafnium compound is tetrakisethylmethylamino hafnium (TEMAH) or tetrakisdiethylamino hafnium (TDEAH), and the second organic hafnium compound is set to be 5 to 55 mass % relative to 100 mass % of the first organic hafnium compound.

17. The method according to claim 16, wherein the second organic hafnium compound is the TEMAH.

18. The method according to claim 17, wherein the second organic metal compound is set to be 5 to 10 mass % or less relative to 100 mass % of the first organic metal compound in terms of the mixture ratio.

19. The method according to claim 16, wherein the oxygen-containing gas is selected from the group consisting of $O_3$ gas, $O_2$ gas, $NO_2$ gas, NO gas, $N_2O$ gas, and $H_2O$ gas.

20. The method according to claim 16, wherein said supplying hafnium source gas and said supplying an oxygen-containing gas are alternately repeated a plurality of times with purging interposed therebetween of exhausting and removing residual gas on the target object without supplying either of the hafnium source gas and the oxygen-containing gas onto the target object, and said purging includes supplying a purge gas onto the target object while vacuum-exhausting the residual gas.

* * * * *